(12) United States Patent
Li et al.

(10) Patent No.: US 11,728,433 B2
(45) Date of Patent: Aug. 15, 2023

(54) VERTICAL TRANSISTOR WITH SELF-ALIGNED GATE

(71) Applicant: INTERNATIONAL BUSINESS MACHINES CORPORATION, Armonk, NY (US)

(72) Inventors: Juntao Li, Cohoes, NY (US); Kangguo Cheng, Schenectady, NY (US); Ruilong Xie, Niskayuna, NY (US); Chanro Park, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 166 days.

(21) Appl. No.: 17/403,294

(22) Filed: Aug. 16, 2021

(65) Prior Publication Data
US 2021/0376140 A1  Dec. 2, 2021

Related U.S. Application Data

(62) Division of application No. 16/546,479, filed on Aug. 21, 2019, now Pat. No. 11,139,399.

(51) Int. Cl.
*H01L 29/78* (2006.01)
*H01L 27/092* (2006.01)
(Continued)

(52) U.S. Cl.
CPC .... *H01L 29/785* (2013.01); *H01L 21/823814* (2013.01); *H01L 21/823821* (2013.01);
(Continued)

(58) Field of Classification Search
CPC ............. H01L 27/0924; H01L 27/1104; H01L 29/7827; H01L 29/66666; H01L 29/785; H01L 21/823814; H01L 21/823821
See application file for complete search history.

(56) References Cited

U.S. PATENT DOCUMENTS

| 4,960,723 A | 10/1990 | Davies |
| 6,689,650 B2 | 2/2004 | Gambino et al. |

(Continued)

OTHER PUBLICATIONS

List of IBM Patents or Patent Applications Treated as Related dated Aug. 16, 2021, 2 pages.

*Primary Examiner* — Jaehwan Oh
*Assistant Examiner* — John M Parker
(74) *Attorney, Agent, or Firm* — Tutunjian & Bitetto, P.C.; Samuel Waldbaum

(57) ABSTRACT

A method of forming a vertical transistor is provided. The method includes forming a first set of vertical fins in a first row on a first bottom source/drain layer, and a second set of vertical fins in a second row on a second bottom source/drain layer, wherein the vertical fins in the same row are separated by a spacing with a sidewall-to-sidewall distance, $S_D$, and the vertical fins in the same column of adjacent rows are separated by a gap having a gap distance, $G_D$. The method further includes forming a gate metal layer on the first set of vertical fins and the second set of vertical fins, wherein the gate metal layer does not fill in the gap between vertical fins in the same column, and forming a cover layer plug in the remaining gap after forming the gate metal layer.

20 Claims, 11 Drawing Sheets

(51) Int. Cl.
*H01L 29/66* (2006.01)
*H01L 21/8238* (2006.01)

(52) U.S. Cl.
CPC .. *H01L 21/823885* (2013.01); *H01L 27/0924* (2013.01); *H01L 29/66666* (2013.01); *H01L 29/66795* (2013.01); *H01L 29/7827* (2013.01)

(56) References Cited

U.S. PATENT DOCUMENTS

| | | |
|---|---|---|
| 9,773,913 B1 | 9/2017 | Balakrishnan et al. |
| 10,103,246 B2 | 10/2018 | Cheng et al. |
| 10,211,315 B2 | 2/2019 | Zang et al. |
| 2018/0254330 A1 | 9/2018 | Bao et al. |
| 2018/0331101 A1 | 11/2018 | Anderson et al. |
| 2018/0350939 A1 | 12/2018 | Basker et al. |
| 2019/0051733 A1 | 2/2019 | Zang |
| 2020/0294803 A1* | 9/2020 | Xu ................ H01L 21/32136 |

* cited by examiner

VERTICAL TRANSISTOR WITH SELF-ALIGNED GATE

BACKGROUND

The present invention generally relates to fin-type transistor devices, and more particularly to vertical transport fin field effect transistors.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of forming a vertical transistor is provided. The method includes forming a first set of vertical fins in a first row on a first bottom source/drain layer, and a second set of vertical fins in a second row on a second bottom source/drain layer, wherein the vertical fins in the same row are separated by a spacing with a sidewall-to-sidewall distance, $S_D$, and the vertical fins in the same column of adjacent rows are separated by a gap having a gap distance, $G_D$. The method further includes forming a gate metal layer on the first set of vertical fins and the second set of vertical fins, wherein the gate metal layer does not fill in the gap between vertical fins in the same column, and forming a cover layer plug in the remaining gap after forming the gate metal layer.

In accordance with another embodiment of the present invention, a method of forming a vertical transistor is provided. The method includes forming a first set of vertical fins in a first row on a first bottom source/drain layer, and a second set of vertical fins in a second row on a second bottom source/drain layer, wherein the vertical fins in the same row are separated by a spacing with a sidewall-to-sidewall distance, $S_D$, and the vertical fins in the same column of adjacent rows are separated by a gap having a gap distance, $G_D$. The method further includes forming a bottom spacer layer on the first bottom source/drain layer and second bottom source/drain layer, and forming a gate dielectric layer on the plurality of vertical fins and bottom spacer layer. The method further includes forming a work function material layer on the gate dielectric layer, and forming a gate metal layer on the work function material layer, wherein the gate metal layer fills in the spacing between adjacent vertical fins in the same row but not the gap between vertical fins in the same column. The method further includes forming a cover layer on the gate metal layer on the plurality of vertical fins, and forming a plug template on the cover layer above the gap. The method further includes removing the portion of the cover layer not covered by the plug template to form a patterned cover layer, removing the plug template, and removing an upper portion of the patterned cover layer to form a cover layer plug in the gap and expose portions of the gate metal layer.

In accordance with yet another embodiment of the present invention, a vertical transistor is provided. The vertical transistor includes a plurality of vertical fins on a substrate, where the vertical fins are arranged in at least two rows and at least two columns, wherein the vertical fins in the same row are separated by a spacing with a sidewall-to-sidewall distance, $S_D$, and the vertical fins in the same column of adjacent rows are separated by a gap having a gap distance, $G_D$. The vertical transistor further includes a bottom spacer layer on the substrate between the plurality of vertical fins, and a gate dielectric layer on a portion of each of the plurality of vertical fins and a portion of the bottom spacer layer. The vertical transistor further includes a work function material layer on the gate dielectric layer, and a top spacer on the work function material layer and the gate dielectric layer adjacent to each of the plurality of vertical fins. The vertical transistor further includes a gate metal layer on the work function material layer, and a gate metal cap on the gate metal layer and adjoining the top spacer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a method of forming vertical transistor devices with a self-aligned gate for scaling beyond the 7 nanometer node that does not depend upon a gate mask cut process in tight pitch structures. In various embodiments, the vertical fin sidewall-to-sidewall distance can be less than the vertical fin end wall-to-end wall distance, the metal layer can fill the gap between adjacent vertical fin sidewalls, whereas an opening can remain between the adjacent vertical fin end walls.

Embodiments of the present invention provide gate structures with both a work function layer and a metal layer in the tight pitch structures without the variability in a gate metal foot at the bottom of a vertical fin. The use of the metal layer and work function layer provides reduced electrical resistances over the use of a work function layer alone in the reduced space. The metal layer can be formed using a conformal deposition on the work function material layer to control the thickness and uniformity. The size and extension of the gate structure foot of an L-shaped gate structure can be controlled by the controlled thickness of the metal layer, work function layer, and gate dielectric layer, where the thickness of the metal layer can determined the amount that the work function layer portion of the foot extends away from the fin sidewall.

Embodiments of the present invention provide vertical transport fin field effect transistor devices with a bi-material top spacer layer, where the top spacer layer over the gate structure can include two dielectric materials.

Embodiments of the present invention provide a method of fabricating a vertical transport fin field effect transistor (VT FinFET) device with a gate structure including a gate dielectric layer, a work function layer, and a gate metal layer having gaps between adjacent fin sidewalls of about 30 nanometers (nm). The gate metal layer can fill the gap between the facing sidewalls of the work function layer on adjacent vertical fins.

Exemplary applications/uses to which the present invention can be applied include, but are not limited to: complementary metal-oxide-semiconductor (CMOS) devices for digital logic circuits (e.g., NAND gates) and memory circuits.

It is to be understood that aspects of the present invention will be described in terms of a given illustrative architecture; however, other architectures, structures, substrate materials and process features and steps can be varied within the scope of aspects of the present invention.

Figure 1:
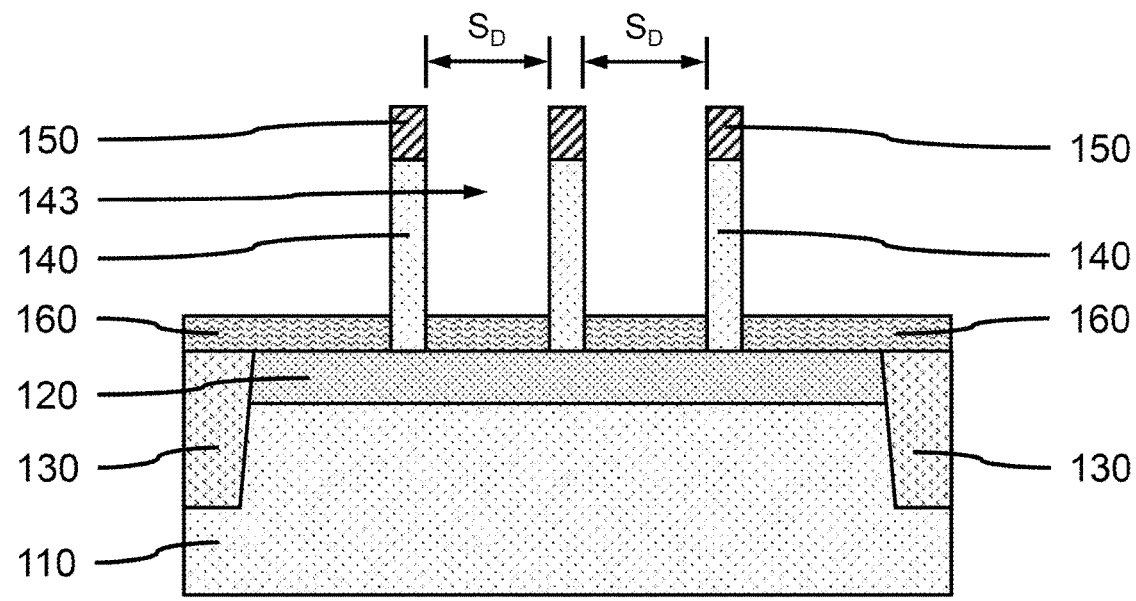
FIG. 1 is a cross-sectional side view showing a plurality of vertical fins on a bottom source/drain layer and substrate, and a bottom spacer layer on the bottom source/drain layer, in accordance with an embodiment of the present invention.

Referring now to the drawings in which like numerals represent the same or similar elements and initially to FIG. 1, a cross-sectional side view of a plurality of vertical fins on a bottom source/drain layer and substrate, and a bottom spacer layer on the bottom source/drain layer is shown, in accordance with an embodiment of the present invention.

In one or more embodiments, a plurality of vertical fins 140 can be formed on a substrate 110, where the vertical fins 140 can be formed by a sidewall image transfer process or a direct-write process. The plurality of vertical fins 140 can be arranged in a grid pattern having at least two rows and at least two columns, where the plurality of vertical fins 140 in the same row can be separated by a sidewall-to-sidewall distance, $S_D$, and the vertical fins 140 in the same column can have the end walls separated by a gap distance, $G_D$.

In one or more embodiments, the substrate 110 can be a semiconductor substrate or a semiconductor-on-insulator (SeOI) substrate, for example, a silicon-on-insulator (SOI) substrate, where the substrate 110 can include a single crystal semiconductor active layer that can form semiconductor devices. In various embodiments, the semiconductor substrate 110 can be a group IV semiconductor, for example, silicon (Si) or germanium (Ge), a group IV-IV compound semiconductor, for example, silicon-germanium (SiGe) or silicon carbide (SiC), or a group III-V compound semiconductor, for example, gallium arsenide (GaAs), indium phosphide (InP), gallium nitride (GaN), or indium gallium phosphide (InGaP).

In one or more embodiments, a bottom source/drain layer 120 can be formed on the substrate, where the bottom source/drain layer 120 can be doped to form an n-type or a p-type bottom source/drain, for example, a silicon (Si) bottom source/drain layer can be n-doped, for example, with phosphorus (P) or arsenic (As), and a silicon-germanium (SiGe) bottom source/drain layer can be p-doped, for example, with boron (B) or gallium (Ga). In various embodiments, the bottom source/drain layer(s) 120 can be formed by epitaxial growth with in situ or ex situ doping. In various embodiments, the bottom source/drain layer(s) 120 can be formed by masking and dopant implantation, for example, using ion beam implantation, gas phase doping, liquid phase doping, solid phase doping, etc.

In one or more embodiments, isolation regions 130 can be formed through the bottom source/drain layer 120, for example, by forming one or more isolation region trench(es) through the bottom source/drain layer 120 and into the undoped region of the substrate 110 by masking and etching, and filling the isolation region trench(es) with an electrically insulating, dielectric material. The isolation regions 130 can be between vertical fins 140 in the same column.

In one or more embodiments, the vertical fins 140 can be formed on the bottom source/drain layer 120 and substrate 110 by forming a semiconductor layer on the bottom source/drain layer by epitaxy and masking and etching the semiconductor layer using a sidewall image transfer (SIT) process. The sidewall image transfer process can be a self-aligned double patterning (SADP), self-aligned triple patterning (SATP), or self-aligned quadruple patterning (SAQP) process. In various embodiments, the vertical fins 140 can be formed by a direct write process using, for example, extreme ultraviolet (EUV) techniques or x-ray techniques. In various embodiments, the semiconductor layer can be a semiconductor material use for the substrate 110.

In one or more embodiments, the vertical fins 140 can have a width in a range of about 4 nm to about 10 nm, or about 5 nm to 7 nm, or about 6 nm, although other widths are also contemplated. In one or more embodiments, the vertical fins 140 can have a height in a range of about 25 nm to about 100 nm, or about 40 nm to 70 nm, or about 30 nm to about 50 nm, although other heights are also contemplated.

In various embodiments, adjacent vertical fins 140 can separated by a spacing 143 with a sidewall-to-sidewall distance, $S_D$, in a range of about 15 nm to about 60 nm, or about 25 nm to about 40 nm, or about 30 nm, although other distances are also contemplated. The sidewall-to-sidewall distance, $S_D$, of the spacings 143 can be the same between each of the vertical fins 140 in the same row on the same bottom source/drain layer.

In one or more embodiments, a fin template 150 can be formed on each of the vertical fins 140, where the fin template(s) 150 can be formed as part of the sidewall image transfer (SIT) process. The fin template(s) 150 can be formed by patterning a hardmask layer on the semiconductor layer forming the vertical fins 140.

In various embodiments, the fin template(s) 150 can be formed from a hardmask material, including, but not limited to, silicon oxide (SiO), silicon nitride (SiN), silicon boronitride (SiBN), silicon carbonitride (SiCN), and combinations thereof.

In one or more embodiments, a bottom spacer layer 160 can be formed on the bottom source/drain layer 120, where the bottom spacer layer 160 can be formed by a directional deposition, for example, a gas cluster ion beam (GCIB) deposition or a high density plasma (HDP) deposition, or a blanket deposition, for example, a chemical vapor deposition (CVD) or plasma enhanced CVD (PECVD) deposition, and etched back by a directional etch, for example, a reactive ion etch (RIE), or an isotropic etch, for example, a wet chemical etch or dry plasma etch.

In various embodiments, the bottom spacer layer 160 can have a thickness in a range of about 3 nm to about 25 nm, or about 6 nm to about 15 nm, or about 8 nm to about 12 nm, although other thicknesses are also contemplated.

In various embodiments, the bottom spacer layer 160 can be an electrically insulating dielectric material, including, but not limited to, silicon oxide (SiO), silicon nitride (SiN), silicon oxynitride (SiON), silicon oxycarbide (SiOC), silicon carbonitride (SiCN), silicon oxy-carbonitride (SiOCN), silicon boronitride (SiBN), silicon borocarbide (SiBC), silicon boro carbonitride (SiBCN), low-k dielectric materials, and combinations thereof. The low-k dielectric materials can be carbon-doped silicon oxide (SiO:C), fluorine doped silicon oxide (SiO:F), silicon based polymeric dielectric materials, for example, hydrogen silsesquioxane (HSQ) and methylsilsesquioxane (MSQ), tetraethoxysilane (TEOS), and combinations thereof.

Figure 2:
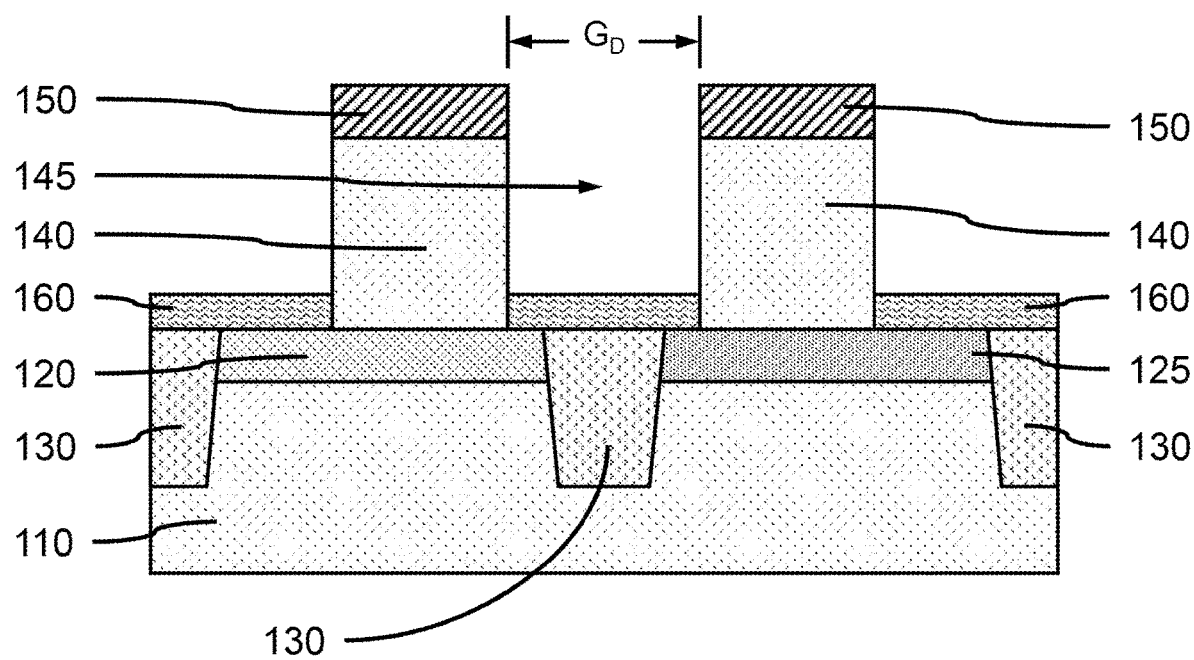
FIG. 2 is a cross-sectional side view perpendicular to FIG. 1 showing the long axis of a pair of adjacent vertical fins with two differently doped bottom source/drain regions separated by an isolation region, in accordance with an embodiment of the present invention.

FIG. 2 is a cross-sectional side view perpendicular to FIG. 1 showing the long axis of a pair of adjacent vertical fins with two differently doped bottom source/drain regions separated by an isolation region, in accordance with an embodiment of the present invention.

In one or more embodiments, a plurality of vertical fins 140 can be on a first bottom source/drain layer 120 with an n-type or a p-type dopant, and a plurality of vertical fins 140 can be on a second bottom source/drain layer 125 having the opposite dopant type, the bottom source/drain layers 120, 125 and plurality of vertical fins 140 can be adjacent to each other. The bottom source/drain layers 120, 125 can be physically and electrically separated by an isolation region 130 between an n-type bottom source/drain layer and a p-type bottom source/drain layer.

In various embodiments, the end walls of the adjacent vertical fins 140 can be separated by a gap 145 having a gap distance, $G_D$, in a range of about 30 nm to about 80 nm, or about 40 nm to about 60 nm, or about 50 nm, although other gap distances are also contemplated. The gap distance, $G_D$, can be larger than the sidewall-to-sidewall distance, $S_D$. In various embodiments, the vertical fins 140 can be a distance from the edge of the intervening isolation region 130 in a range of about 15 nm to about 30 nm, although other distances are also contemplated.

In various embodiments, the vertical fins 140 can have a length in a range of about 20 nm to about 100 nm, or about 30 nm to about 60 nm, or about 40 nm, although other lengths are also contemplated.

Figure 3:
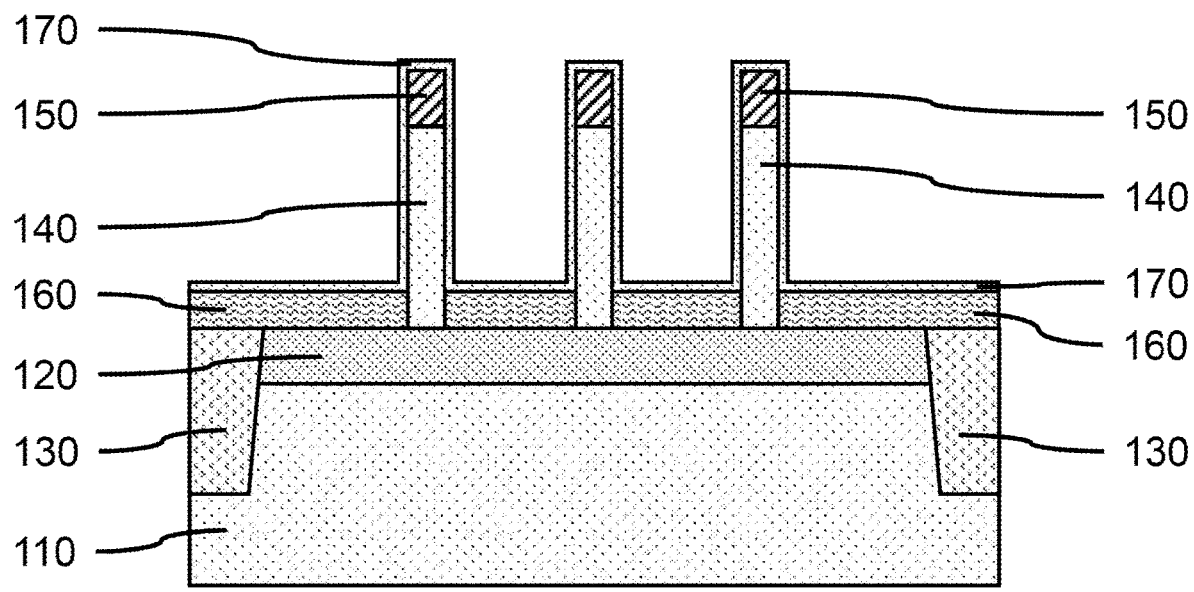
FIG. 3 is a cross-sectional side view showing a gate dielectric layer formed on the plurality of vertical fins and the bottom spacer layer, in accordance with an embodiment of the present invention.

FIG. 3 is a cross-sectional side view showing a gate dielectric layer formed on the plurality of vertical fins and the bottom spacer layer, in accordance with an embodiment of the present invention.

In one or more embodiments, a gate dielectric layer 170 can be formed on the plurality of vertical fins 140, where the gate dielectric layer 170 can be formed by a conformal deposition, for example, an atomic layer deposition (ALD), a plasma enhanced ALD (PEALD), or a combination thereof. The gate dielectric layer 170 can cover exposed surfaces of the bottom spacer layer 160, vertical fins 140, and fin templates 150.

In various embodiments, the gate dielectric layer 170 can be a dielectric material, including, but not limited to, silicon oxide (SiO), silicon nitride (SiN), silicon boro carbonitride (SiBCN), a high-k dielectric, and combinations thereof. The high-k dielectric material can include, but not limited to, metal oxides, for example, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k dielectric material may further include dopants such as lanthanum, aluminum, magnesium, or combinations thereof.

In various embodiments, the gate dielectric layer 170 can have a thickness in a range of about 1 nm to about 3 nm, or about 2 nm, although other thicknesses are also contemplated.

Figure 4:
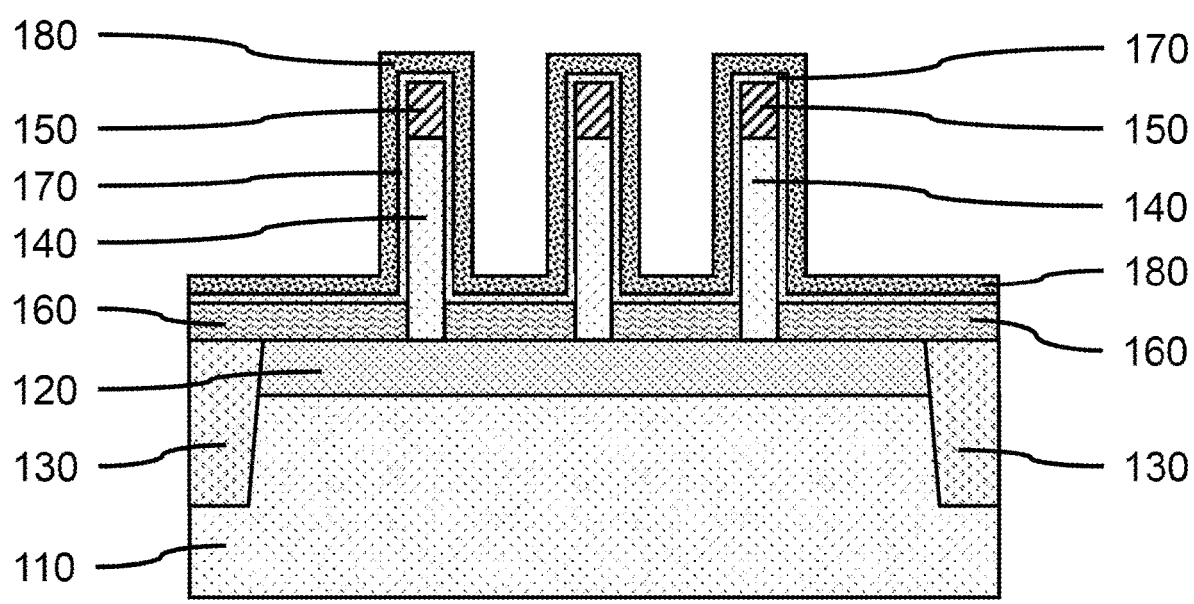
FIG. 4 is a cross-sectional side view showing a work function layer on the gate dielectric layer, in accordance with an embodiment of the present invention.

FIG. 4 is a cross-sectional side view showing a work function layer on the gate dielectric layer, in accordance with an embodiment of the present invention.

In one or more embodiments, a work function material layer 180 can be formed on the gate dielectric layer 170 on the vertical fins 140 and bottom spacer layer 160, where the work function material layer 180 can be formed by a conformal deposition (e.g., ALD, PEALD).

In various embodiments, the work function material layer 180 can be a conducting transition metal nitride compound, for example, titanium nitride (TiN), tantalum nitride (TaN), zirconium nitride (ZrN), hafnium nitride (HfN), a conducting transition metal carbide compound material, for example, tantalum carbide (TaC), titanium carbide (TiC), titanium aluminum nitride (TiAlN), titanium-aluminum-carbon nitride (TiAlCN), titanium-aluminum carbide (TiAlC), tantalum-aluminum carbide (TaAlC), tantalum-aluminum-carbon nitride (TaAlCN), titanium nitride doped with lanthanum (TiN:La), tantalum nitride doped with lanthanum (TaN:La) and combinations thereof.

In various embodiments, the work function material layer 180 can have a thickness in a range of about 3 nm to about 15 nm, or about 4 nm to about 8 nm, or about 5 nm, although other thicknesses are also contemplated.

Figure 5:
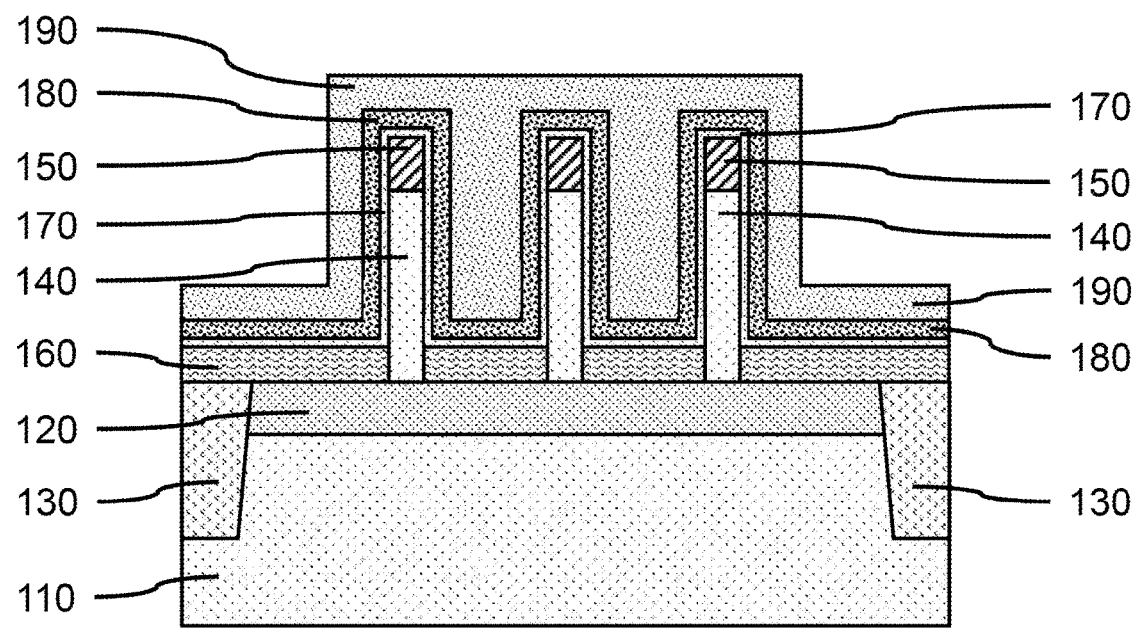
FIG. 5 is a cross-sectional side view showing a gate metal layer on the work function layer, where the metal layer pinches off the gaps between adjacent vertical fins, in accordance with an embodiment of the present invention.

FIG. 5 is a cross-sectional side view showing a gate metal layer on the work function layer, where the metal layer pinches off the gaps between adjacent vertical fins, in accordance with an embodiment of the present invention.

In one or more embodiments, a gate metal layer 190 can be formed on the work function material layer 180, where the gate metal layer 190 can be formed by a conformal deposition, for example, ALD, PEALD, or a combination thereof. The gate metal layer 190 can cover the work function material layer 180 on the substrate 110 and on the vertical fins 140, where the gate metal layer 190 can be sufficiently thick to fill in the spaces between adjacent vertical fins.

In various embodiments, the gate metal layer 190 can have a thickness in a range of about 5 nm to about 25 nm, or about 8 nm to about 15 nm, or about 10 nm, although other thicknesses are also contemplated.

Figure 6:
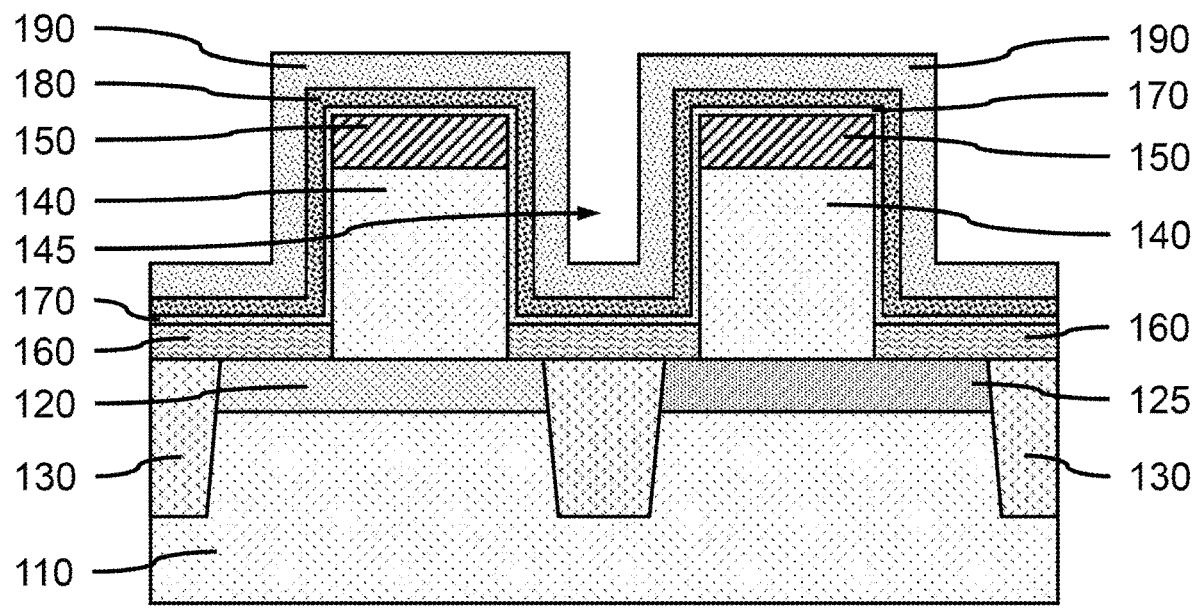
FIG. 6 is a cross-sectional side view perpendicular to FIG. 5 showing the long axis of a pair of adjacent vertical fins with a gate stack of the gate dielectric layer, work function layer, and gate metal layer that does not pinch off the gap between the adjacent vertical fin ends, in accordance with an embodiment of the present invention.

FIG. 6 is a cross-sectional side view perpendicular to FIG. 5 showing the long axis of a pair of adjacent vertical fins with a gate stack of the gate dielectric layer, work function layer, and gate metal layer that does not pinch off the gap between the adjacent vertical fin ends, in accordance with an embodiment of the present invention.

In one or more embodiments, the gate metal layer 190 can cover the work function material layer 180 on the end walls of the vertical fins, such that the thickness of the gate metal layer 190 on the facing end walls does not fill in the gap 145. Where the gap distance, $G_D$, is in a range of about 30 nm to about 80 nm, the combined thicknesses of the gate dielectric layer, work function layer, and gate metal layer on each of the facing vertical fins can be less than gap distance, $G_D$.

Figure 7:
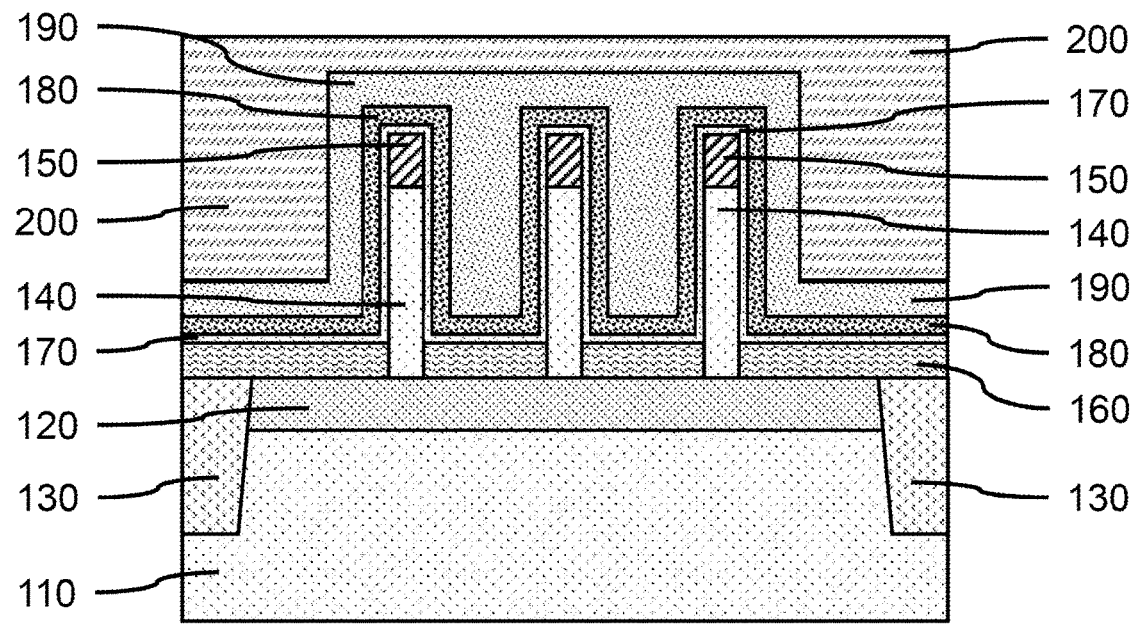
FIG. 7 is a cross-sectional side view showing a cover layer formed on the metal layer and plurality of vertical fins, in accordance with an embodiment of the present invention.

FIG. 7 is a cross-sectional side view showing a cover layer formed on the metal layer and plurality of vertical fins, in accordance with an embodiment of the present invention.

In one or more embodiments, a cover layer 200 can be formed on the gate metal layer 190 on the plurality of vertical fins 140, where the cover layer 200 can be formed by a blanket deposition (e.g., CVD, PECVD, spin-on). The cover layer 200 can be over the gate metal layer 190 on the plurality of vertical fins 140. A chemical-mechanical polishing can be used to smooth and flatten the cover layer 200.

In various embodiments, the cover layer 200 can be an organic planarization layer (OPL), or other suitable spin-on coating. The cover layer 200 can include a polymeric material. In various embodiments, the organic planarization layer (OPL) can be a polyacrylate resin, epoxy resin, phenol resin, polyamide resin, polyimide resin, unsaturated polyester resin, polyphenylenether resin, polyphenylenesulfide resin, or benzocyclobutene (BCB), that can be patterned and developed. The OPL can be spun onto the surface, and a CMP can be used to provide a smooth, flat surface.

Figure 8:
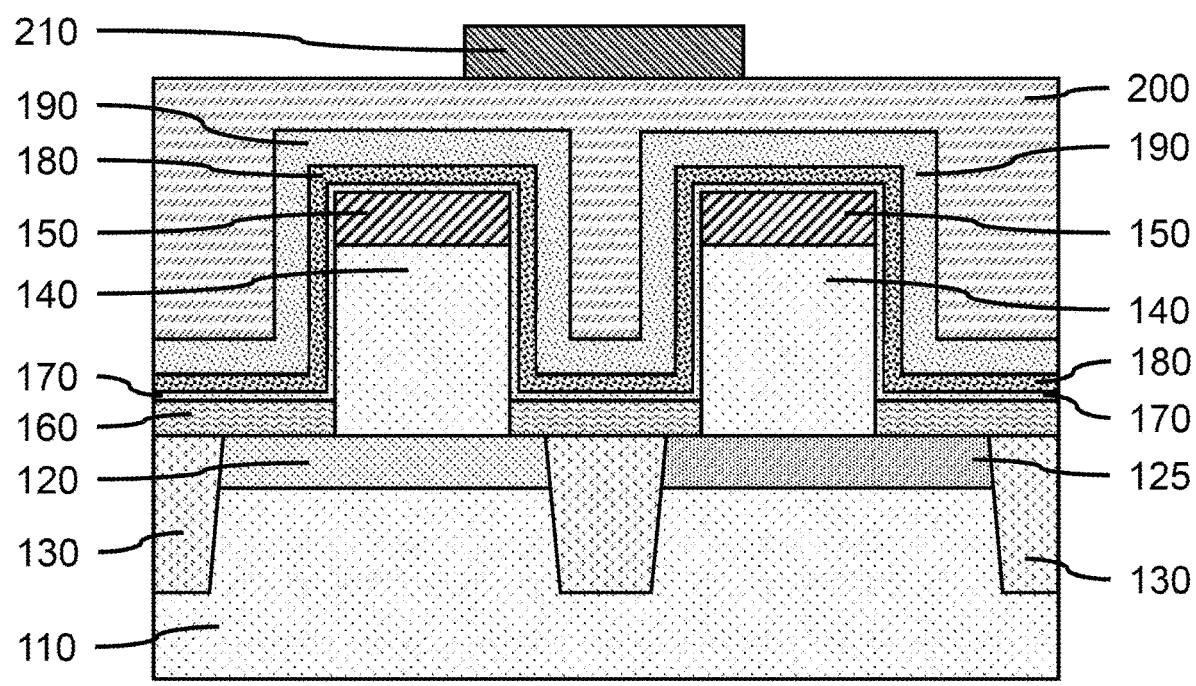
FIG. 8 is a cross-sectional side view perpendicular to FIG. 7 showing the long axis of a pair of adjacent vertical fins with a patterned plug template on the cover layer above the gap between the adjacent vertical fins, in accordance with an embodiment of the present invention.

FIG. 8 is a cross-sectional side view perpendicular to FIG. 7 showing the long axis of a pair of adjacent vertical fins with a patterned plug template on the cover layer above the gap between the adjacent vertical fins, in accordance with an embodiment of the present invention.

In one or more embodiments, the cover layer 200 can fill in the remaining open portion of the gap 145 between the facing walls of the gate metal layer 190.

In one or more embodiments, a plug template 210 can be formed on the cover layer 200 above the gap 145 between the adjacent vertical fins 140. The plug template 210 can be formed by depositing a hardmask layer (e.g., SiO, SiN, etc.) on the cover layer, masking the hardmask layer using lithography techniques, and removing the exposed cover layer by etching (e.g., RIE). In various embodiments, the plug template 210 can overlap portions of the fin template 150 and vertical fins 140 on opposite sides of the gap 145.

Figure 9:
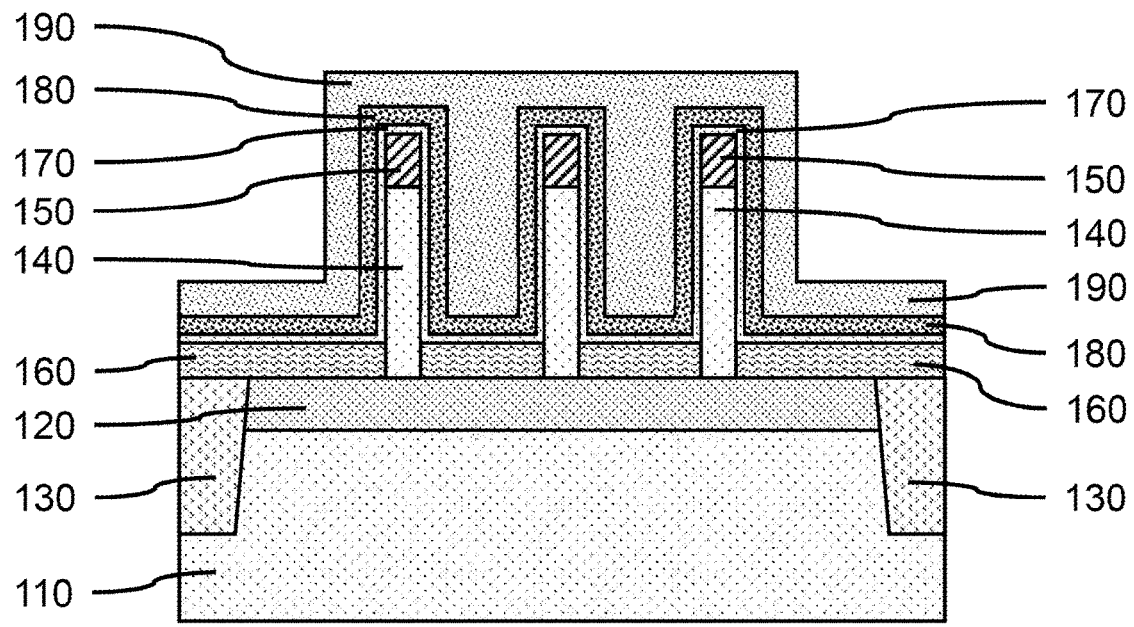
FIG. 9 is a cross-sectional side view showing a portion of the cover layer over the plurality of vertical fins removed to expose portions of the metal layer, in accordance with an embodiment of the present invention.

FIG. 9 is a cross-sectional side view showing a portion of the cover layer over the plurality of vertical fins removed to expose portions of the metal layer, in accordance with an embodiment of the present invention.

In one or more embodiments, the portion of the cover layer 200 not masked by the plug template 210 can be removed, where the portion of the cover layer 200 can be removed using a selective, directional etch (e.g., RIE). Removal of the portion(s) of the cover layer 200 can expose the underlying sections of the gate metal layer 190.

Figure 10:
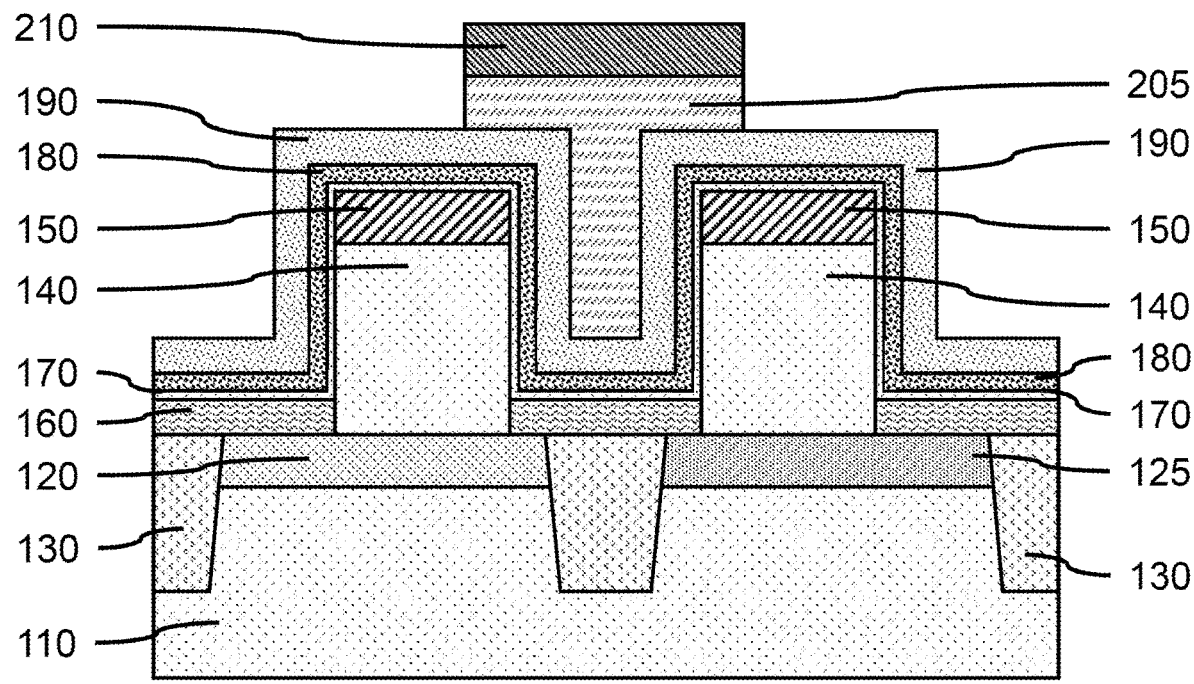
FIG. 10 is a cross-sectional side view perpendicular to FIG. 9 showing the long axis of a pair of adjacent vertical fins with a patterned cover layer plug in the gap between the adjacent vertical fins beneath the plug template, in accordance with an embodiment of the present invention.

FIG. 10 is a cross-sectional side view perpendicular to FIG. 9 showing the long axis of a pair of adjacent vertical fins with a patterned cover layer plug in the gap between the adjacent vertical fins beneath the plug template, in accordance with an embodiment of the present invention.

In one or more embodiments, a portion of the cover layer 200 covered by the plug template 210 can remain on the gate metal layer 190 to form a patterned cover layer 205. The patterned cover layer 205 can be above each of the fin templates 150 on adjacent vertical fins 140 and fill in the remaining open portion of the gap 145.

Figure 11:
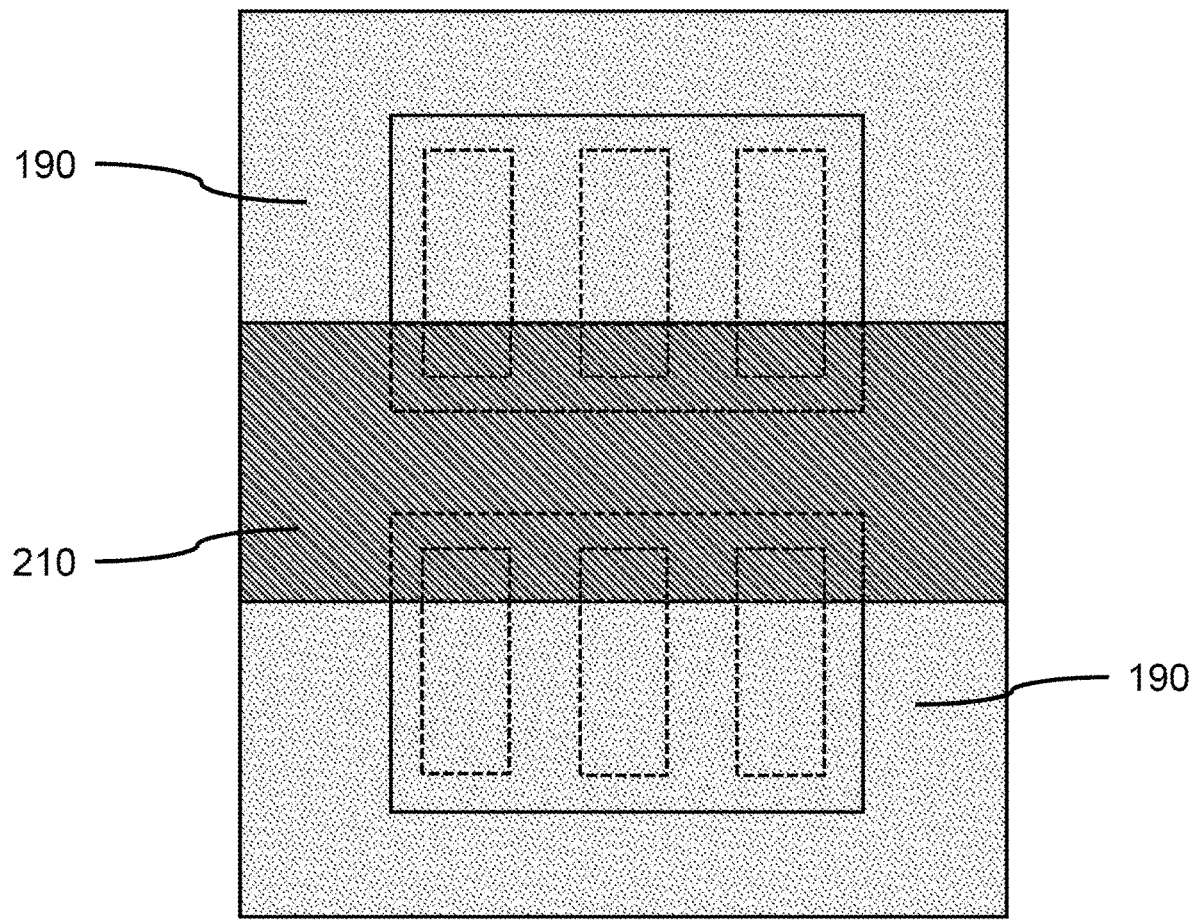
FIG. 11 is a top-down view of the positioning of the plug template and exposed portions of the gate metal layer on opposite sides of the plug template after removing portions of the cover layer, in accordance with an embodiment of the present invention.

FIG. 11 is a top-down view of the positioning of the plug template and exposed portions of the gate metal layer on opposite sides of the plug template after removing portions of the cover layer, in accordance with an embodiment of the present invention.

In various embodiments, the plug template 210 can be a strip of hardmask material that covers a portion of the gate metal layer 190 on each of the plurality of vertical fins 140 on opposite sides of the gap 145. Portions of the gate metal layer 190 on opposite sides of the plug template 210 can be exposed by removal of portions of the cover layer 200.

Figure 12:
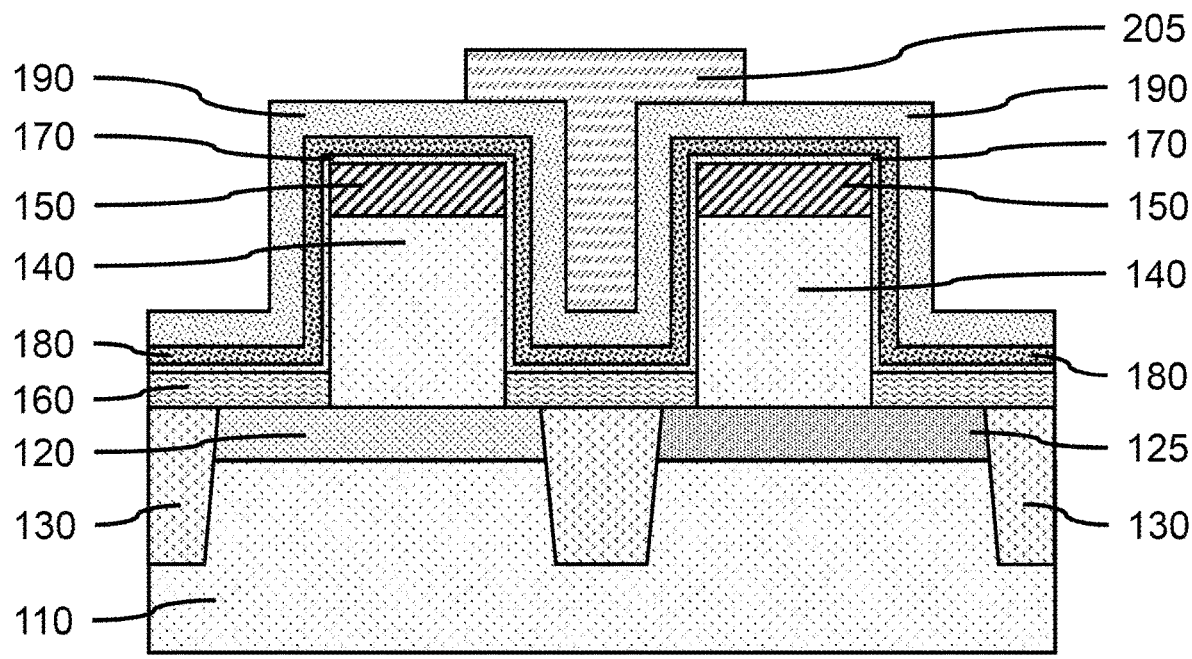
FIG. 12 is a cross-sectional side view perpendicular to FIG. 9 showing the long axis of a pair of adjacent vertical fins with the plug template removed to expose the cover layer plug, in accordance with an embodiment of the present invention.

FIG. 12 is a cross-sectional side view perpendicular to FIG. 10 showing the long axis of a pair of adjacent vertical fins with the plug template removed to expose the cover layer plug, in accordance with an embodiment of the present invention.

In one or more embodiments, the plug template 210 can be removed, for example, using a selective isotropic etch (e.g., wet chemical etch), to expose the underlying patterned cover layer 205.

Figure 13:
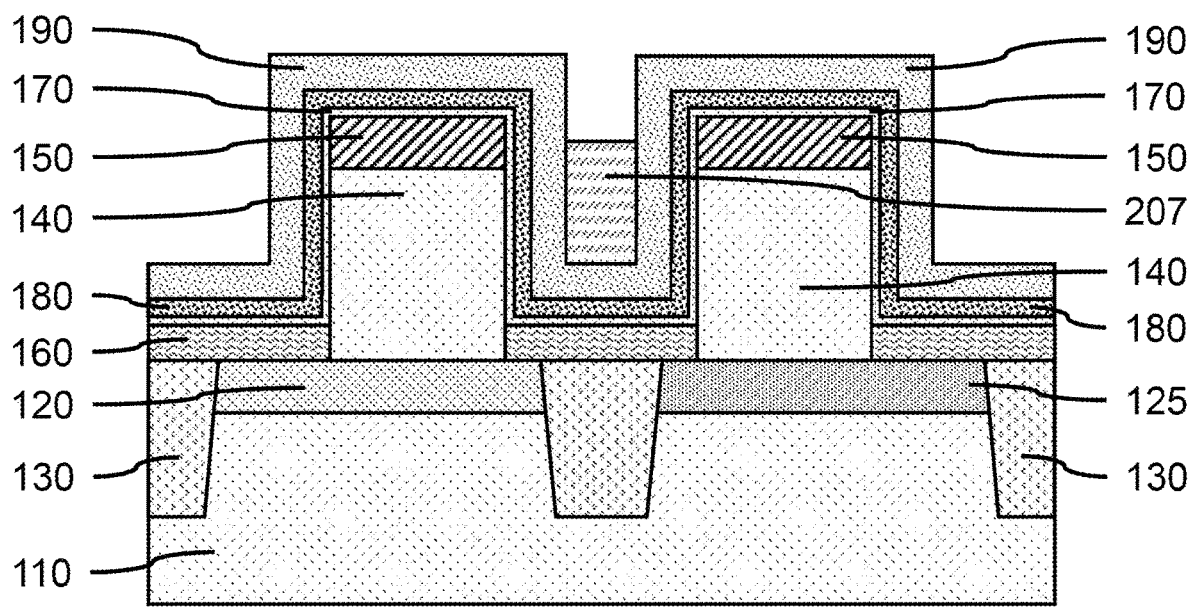
FIG. 13 is a cross-sectional side view perpendicular to FIG. 9 showing the long axis of a pair of adjacent vertical fins with the height of the cover layer plug reduced to below the top surface of the fin template to form a gap plug, in accordance with an embodiment of the present invention.

FIG. 13 is a cross-sectional side view perpendicular to FIG. 10 showing the long axis of a pair of adjacent vertical fins with the height of the cover layer plug reduced to below the top surface of the fin template to form a gap plug, in accordance with an embodiment of the present invention.

In one or more embodiments, an upper portion of the patterned cover layer 205 can be removed using a selective, directional etch (e.g., RIE) to expose the underlying gate metal layer 190. The height of the patterned cover layer 205 in the gap 145 can be reduced using the selective, directional etch, to form a cover layer plug 207 in the gap 145. The top surface of the cover layer plug 207 can be above the top surface of the adjacent vertical fins 140 and between the top surface and the bottom surface of the fin templates 150 on the adjacent vertical fins 140.

Figure 14:
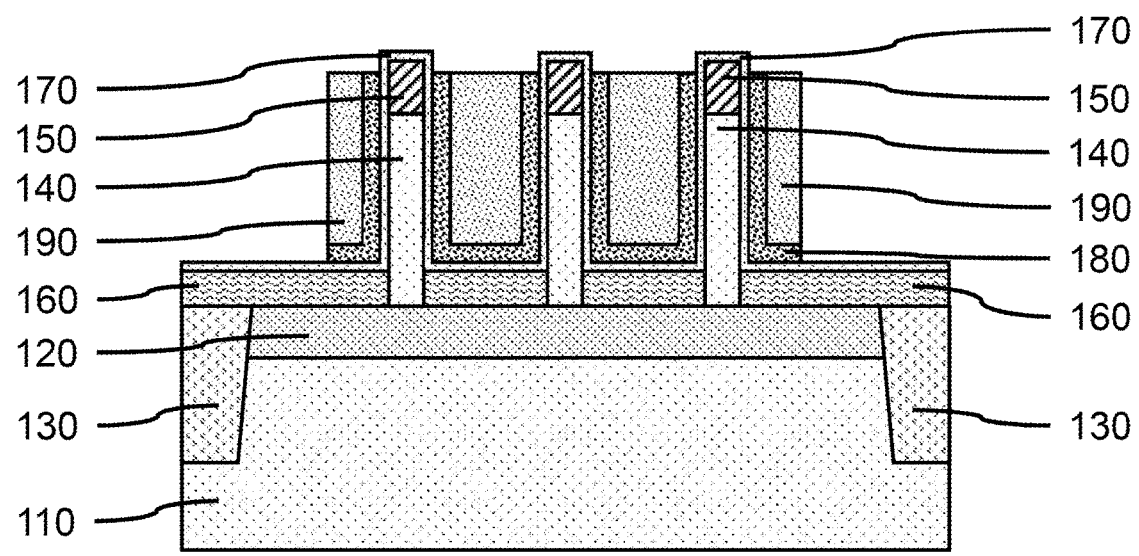
FIG. 14 is a cross-sectional side view showing a portion of the metal layer and the work function layer removed from the gate dielectric layer on the fin templates, in accordance with an embodiment of the present invention.

FIG. 14 is a cross-sectional side view showing a portion of the metal layer and the work function layer removed from the gate dielectric layer on the fin templates, in accordance with an embodiment of the present invention.

In one or more embodiments, an upper exposed portion of the gate metal layer 190 and an exposed lower portion of the gate metal layer on the bottom spacer layer 160 can be removed using a selective, directional etch (e.g., RIE), to expose an underlying portion of the work function layer 180. The selective, directional etch can remove the gate metal layer 190 along the horizontal surfaces (top surfaces) of the gate dielectric layer 170 and fin templates 150. The portions of the gate metal layer 190 along and parallel with the sidewalls and end walls of the plurality of vertical fins, as well as between the adjacent vertical fins 140 can remain to form portions of the gate structure.

In one or more embodiments, a portion of the work function layer 180 expose by removing the upper portion and lower portions of the gate metal layer 190 can be removed to expose the underlying gate dielectric layer 170. The portions of the gate dielectric layer 170 on and parallel with the bottom spacer layer 160 can also be exposed.

Figure 15:
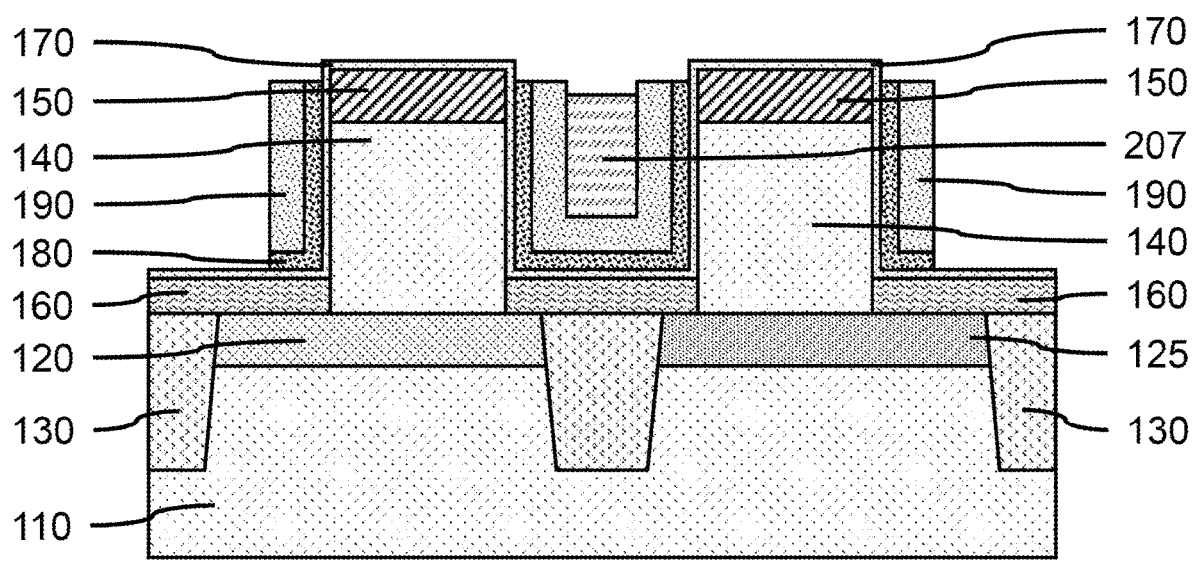
FIG. 15 is a cross-sectional side view perpendicular to FIG. 14 showing the long axis of a pair of adjacent vertical fins with a portion of the metal layer and the work function layer removed from the gate dielectric layer on the fin templates, in accordance with an embodiment of the present invention.

FIG. 15 is a cross-sectional side view perpendicular to FIG. 14 showing the long axis of a pair of adjacent vertical fins with a portion of the metal layer and the work function layer removed from the gate dielectric layer on the fin templates, in accordance with an embodiment of the present invention.

In various embodiments, the top edges of the work function layer 180 and gate metal layer 190 can be below the top surface of the fin templates 150, but above the top surface of the cover layer plug 207.

Figure 16:
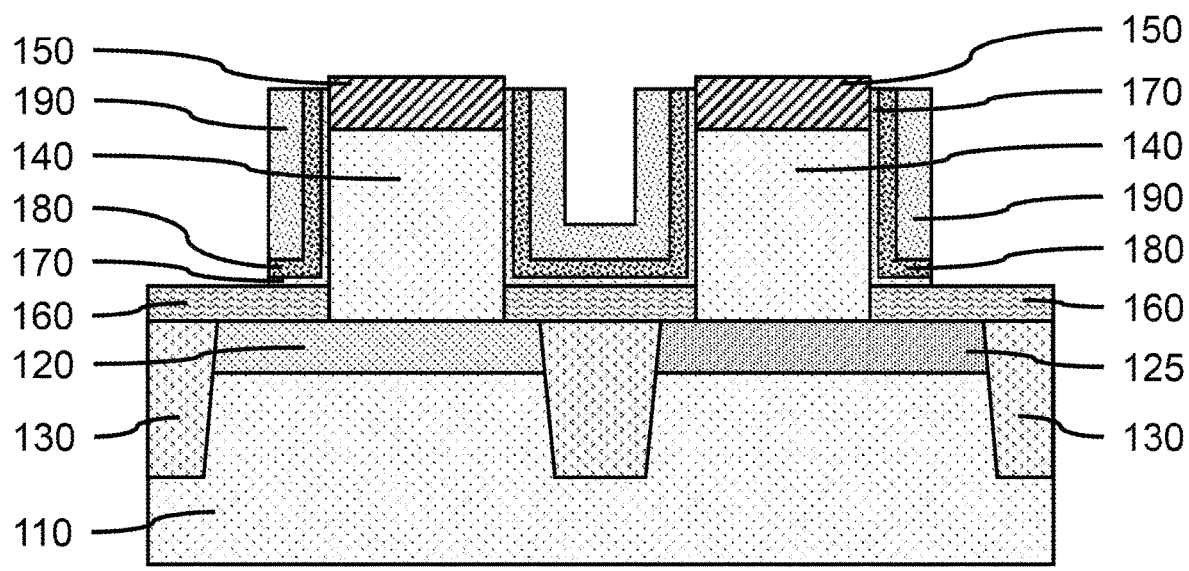
FIG. 16 is a cross-sectional side view perpendicular to FIG. 14 showing the long axis of a pair of adjacent vertical fins with the gap plug removed, and exposed portions of the gate dielectric layer removed from the fin templates and bottom spacer layer, in accordance with an embodiment of the present invention.

FIG. 16 is a cross-sectional side view perpendicular to FIG. 14 showing the long axis of a pair of adjacent vertical fins with the gap plug removed, and exposed portions of the gate dielectric layer removed from the fin templates and bottom spacer layer, in accordance with an embodiment of the present invention.

In one or more embodiments, the exposed portions of the gate dielectric layer 170 can be removed using a selective, directional etch (e.g., RIE) to expose the fin templates 150 and underlying portion of the bottom spacer layer 160. The thickness of the remaining portions of the gate metal layer 190 can determine the length of an L-shaped foot of the gate structure, including the work function layer 180 and gate dielectric layer 170, along the bottom spacer layer 160 extending away from the sidewall of a vertical fin 140. In various embodiments, the length of a foot of the adjacent gate structures can be greater than the end wall-to-end wall distance, $G_D$, so the gate structure is U-shaped between adjacent vertical fins 140.

In one or more embodiments, the cover layer plug 207 can be removed from the gap 145 using a selective, isotropic etch (e.g., wet chemical etch) to expose the portion of the gate metal layer 190 in the gap 145. The remaining portions of the gate metal layer 190 and work function layer 180 can form a common gate structure and electrical connection for an n-type FinFET and a p-type FinFET forming a CMOS device.

Figure 17:
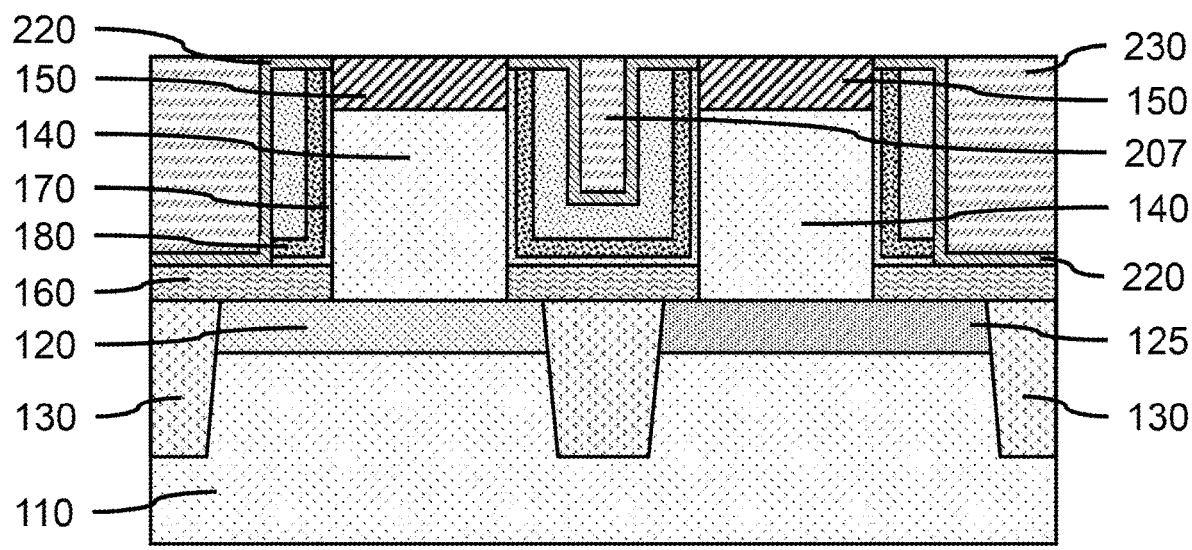
FIG. 17 is a cross-sectional side view perpendicular to FIG. 14 showing the long axis of a pair of adjacent vertical fins with a protective liner layer formed on the metal layer and work function layer, and an interlayer dielectric (ILD) layer formed on the protective liner layer, in accordance with an embodiment of the present invention.

FIG. 17 is a cross-sectional side view perpendicular to FIG. 14 showing the long axis of a pair of adjacent vertical fins with a protective liner layer formed on the metal layer and work function layer, and an interlayer dielectric (ILD) layer formed on the protective liner layer, in accordance with an embodiment of the present invention.

In one or more embodiments, a protective liner layer 220 can be formed on the exposed portions of the gate metal layer 190 and work function layer 180, where the protective liner layer 200 can be formed by a conformal deposition (e.g., ALD, PEALD).

In various embodiments, the protective liner layer 220 can be a dielectric material, including, but not limited to, silicon nitride (SiN), silicon boronitride (SiBN), silicon carbonitride (SiCN), silicon boro carbonitride (SiBCN) and combinations thereof.

In various embodiments, the protective liner layer 220 have a thickness in a range of about 2 nm to about 4 nm, or about 3 nm, although other thicknesses are also contemplated.

In one or more embodiments, an interlayer dielectric (ILD) layer 230 can be formed on the protective liner layer 220, where the ILD layer 230 can be formed by a blanket deposition (e.g., CVD, PECVD, spin-on). A CMP can be used to removed excess ILD layer material above the top surface of the fin templated 150. The conformal liner layer 220 can be deposited first as an encapsulation layer on the gate layers. Then an ILD layer 230 can be deposited followed by a planarization process which can stop on the top surface of the fin template 150.

In various embodiments, the ILD layer 230 can be an electrically insulating, dielectric material, including, but not limited to, silicon oxide (SiO), silicon oxynitride (SiON), a low-k dielectric material, carbon doped silicon oxide, fluorine doped silicon oxide, boron carbon nitride (BCN), hydrogen silsesquioxane polymer (HSQ), methyl silsesquioxane polymer (MSQ), methyl doped silica or $SiO_x(CH_3)_y$ or $SiC_xO_yH_z$, organosilicate glass (SiCOH), porous SiCOH, and combinations thereof. Excess ILD material may be etched back or removed by chemical-mechanical polishing (CMP). A chemical-mechanical polishing can be used to removed excess ILD material and provide a smooth flat surface.

Figure 18:
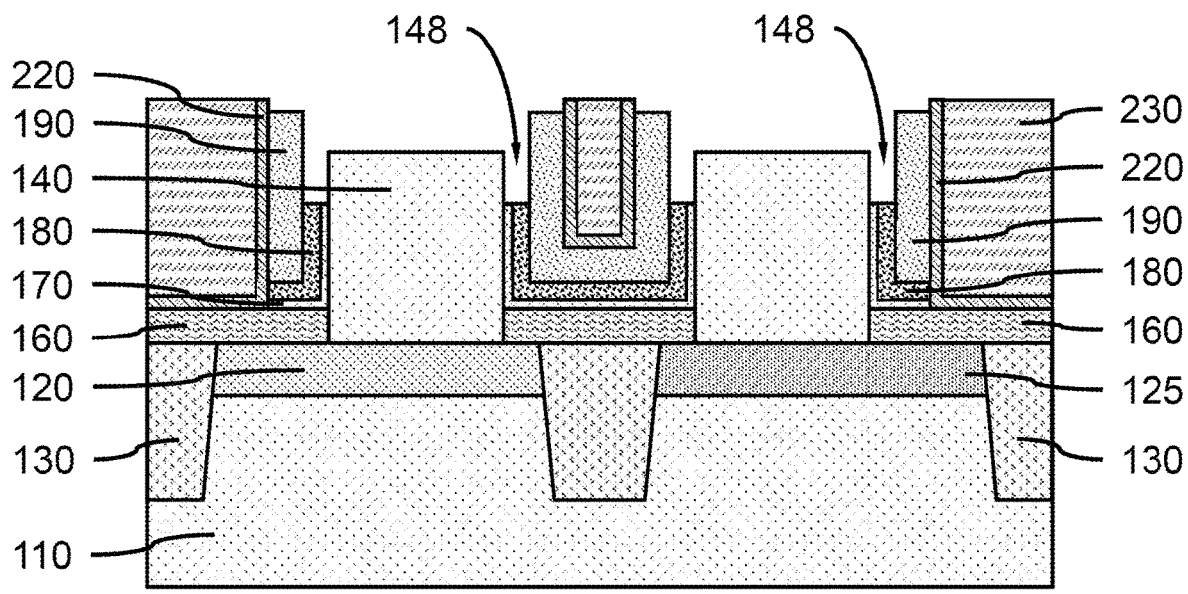
FIG. 18 is a cross-sectional side view perpendicular to FIG. 14 showing the long axis of a pair of adjacent vertical fins with the fin templates removed, and exposed portions of the work function layer and gate dielectric layer removed, in accordance with an embodiment of the present invention.

FIG. 18 is a cross-sectional side view perpendicular to FIG. 14 showing the long axis of a pair of adjacent vertical fins with the fin templates removed, and exposed portions of the work function layer and gate dielectric layer removed, in accordance with an embodiment of the present invention.

In one or more embodiments, the fin templates 150 can be removed using a selective, isotropic etch (e.g., wet chemical etch) to expose the underlying top surfaces of the vertical fins 140 and a portion of the gate dielectric layer 170 extending above top surfaces of the vertical fins 140.

In various embodiments, after the CMP of ILD layer 230, where the protective liner layer 220 can be the same material or similar materials with similar etch properties as the fin templates 150, the protective liner layer 220 and fin templates 150 can be selectively removed with respect to the fin 140, using for example, a selective etch process. The selective etch process can include, for example, a wet chemical etch process containing phosphoric acid, to remove the fin templates 150, as well as the exposed portions of the protective liner layer 220.

In one or more embodiments, the exposed portion of the gate dielectric layer 170 extending above the vertical fin 140 can be removed using a selective, isotropic etch (e.g., wet chemical etch). The gate dielectric layer 170 can be removed down along the sides of the vertical fin to expose an upper portion of the vertical fin.

In one or more embodiments, the portion of the work function layer 180 exposed by removing the gate dielectric layer 170 can be removed using a selective, isotropic etch (e.g., wet chemical etch). The work function layer 180 can be removed down along the sides of the vertical fin. Portions of the gate metal layer 190 can remain adjoining the protective liner layer 220, such that a channel 148 is formed between the upper portion of the vertical fin and the gate metal layer.

In various embodiments, an upper portion of the vertical fins 140 extending about 5 nm to about 10 nm from the top edge of the gate dielectric layer 170 can be exposed. The recessing of the work function layer 180 can determine the final gate length of the device.

Figure 19:
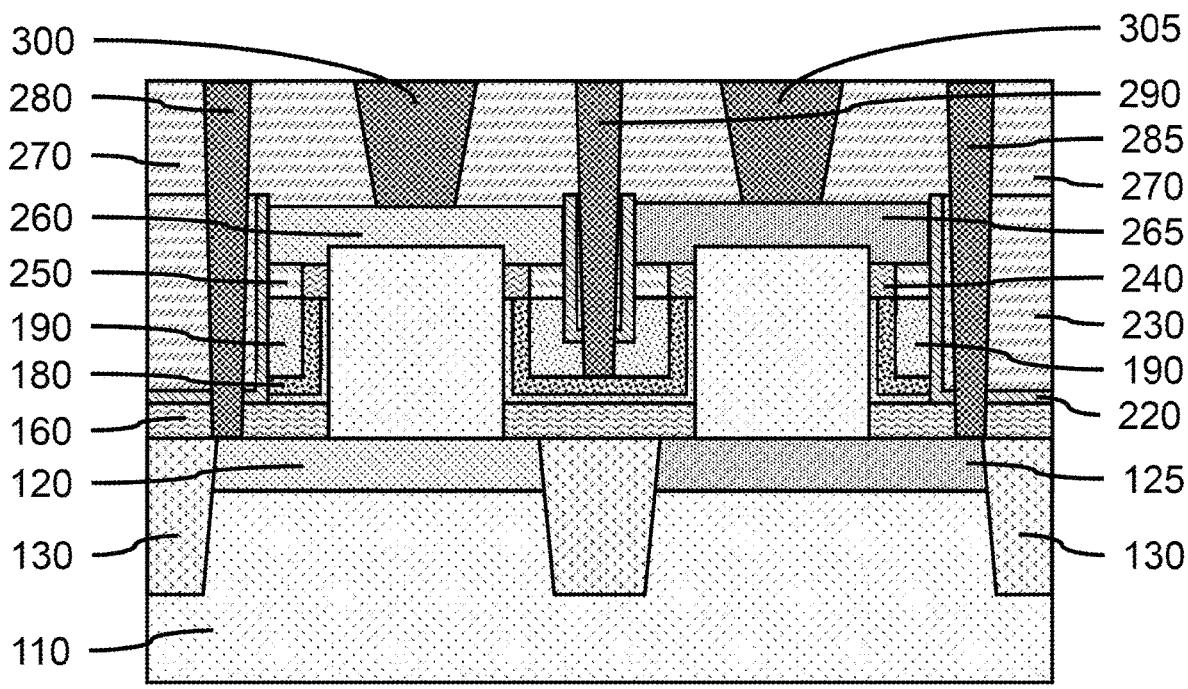
FIG. 19 is a cross-sectional side view perpendicular to FIG. 14 showing the long axis of a pair of adjacent vertical fins with top source/drains formed on the vertical fins and electrical contacts formed to the gate structure and top and bottom source/drains, in accordance with an embodiment of the present invention.

FIG. 19 is a cross-sectional side view perpendicular to FIG. 14 showing the long axis of a pair of adjacent vertical fins with top source/drains formed on the vertical fins and electrical contacts formed to the gate structure and top and bottom source/drains, in accordance with an embodiment of the present invention.

In one or more embodiments, a top spacer 240 can be formed in the channel 148 adjacent to the vertical fin 140, where the top spacer 240 can be formed by a conformal deposition (e.g., ALD, PEALD), and an etch-back using a selective, isotropic etch. The top spacer 240 can cover the top edges of the gate dielectric layer 170 and the work function layer 180.

In various embodiments, the top spacer 240 can be an electrically insulating dielectric material, including, but not limited to, silicon oxide (SiO), silicon nitride (SiN), silicon oxynitride (SiON), silicon boro carbonitride (SiBCN), silicon oxycarbide (SiOC), silicon carbonitride (SiCN), silicon oxy-carbonitride (SiOCN), silicon boronitride (SiBN), silicon borocarbide (SiBC), low-k dielectric materials, and combinations thereof. The low-k dielectric materials can be carbon-doped silicon oxide (SiO:C), fluorine doped silicon oxide (SiO:F), silicon based polymeric dielectric materials, for example, hydrogen silsesquioxane (HSQ) and methylsilsesquioxane (MSQ), tetraethoxysilane (TEOS), and combinations thereof.

In one or more embodiments, the portions of the gate metal layers 190 extending above the top spacer 240 can be removed using a selective, isotropic etch. Portions of the gate metal layers 190 between the top spacer 240 and the protective liner layer 220 can be removed by the selective isotropic etch to form a second channel between the top spacer and the protective liner layer.

In one or more embodiments, a gate metal cap 250 can be formed in the second channel by a conformal deposition (e.g., ALD, PEALD), and an etch-back using a selective, isotropic etch. The gate metal cap 250 can cover the top edges of the gate metal layer 190.

In various embodiments, the gate metal cap 250 can be an electrically insulating dielectric material, including, but not limited to, silicon oxide (SiO), silicon nitride (SiN), silicon oxynitride (SiON), silicon boro carbonitride (SiBCN), silicon oxycarbide (SiOC), silicon carbonitride (SiCN), silicon oxy-carbonitride (SiOCN), silicon boronitride (SiBN), silicon borocarbide (SiBC), low-k dielectric materials, and combinations thereof. The low-k dielectric materials can be carbon-doped silicon oxide (SiO:C), fluorine doped silicon oxide (SiO:F), silicon based polymeric dielectric materials, for example, hydrogen silsesquioxane (HSQ) and methylsilsesquioxane (MSQ), tetraethoxysilane (TEOS), and combinations thereof. The gate metal cap 250 can be a different dielectric material from the top spacer 240.

In one or more embodiments, a first top source/drain 260 can be formed on the plurality of the vertical fins 140 on one side of the gap 145, and a second top source/drain 265 can be formed on the plurality of vertical fins 140 on the opposite side of the gap 145. The first top source/drain 260 can be an n-type or a p-type top source/drain, and the second top source/drain 265 can have the opposite dopant type from the first top source/drain 260. The dopant type of the first top source/drain 260 can be the same as the dopant type of the first bottom source/drain layer 120. The dopant type of the second top source/drain 265 can be the same as the dopant type of the second bottom source/drain layer 125. The top source/drains 260, 265 can be formed by epitaxial growth on the exposed portion of the vertical fin 140 with in situ and/or ex situ doping. A plurality of the vertical fins 140 can be masked using lithographic processes, while a first top source/drain with a first type of dopant is formed, and the top source/drains can be masked while a second top source/drain is formed.

In one or more embodiments, a second ILD layer 270 can be formed on the first ILD layer 230 and the top source/drains 260, 265 by a blanket deposition and CMP.

In one or more embodiments, a first bottom source/drain contact 280 can be formed in the first ILD layer 230 and second ILD layer 270 by masking and etching down to the first bottom source/drain layer 120. A conductive material can be formed in the etched opening. A first top source/drain contact 300 can be formed in the second ILD layer 270 by masking and etching down to the first top source/drain 260, and filling the opening with a conductive material (e.g., metal).

In one or more embodiments, a second bottom source/drain contact 285 can be formed in the first ILD layer 230 and second ILD layer 270 by masking and etching down to the second bottom source/drain layer 125. A conductive material can be formed in the etched opening. A second top source/drain contact 305 can be formed in the second ILD layer 270 by masking and etching down to the second top source/drain 265, and filling the opening with a conductive material (e.g., metal).

In one or more embodiments, a common gate contact 290 can be formed in the first ILD layer 230 and second ILD layer 270 by masking and etching down to the gate metal layer 190 and work function layer 180 between the adjacent vertical fins.

Figure 20:
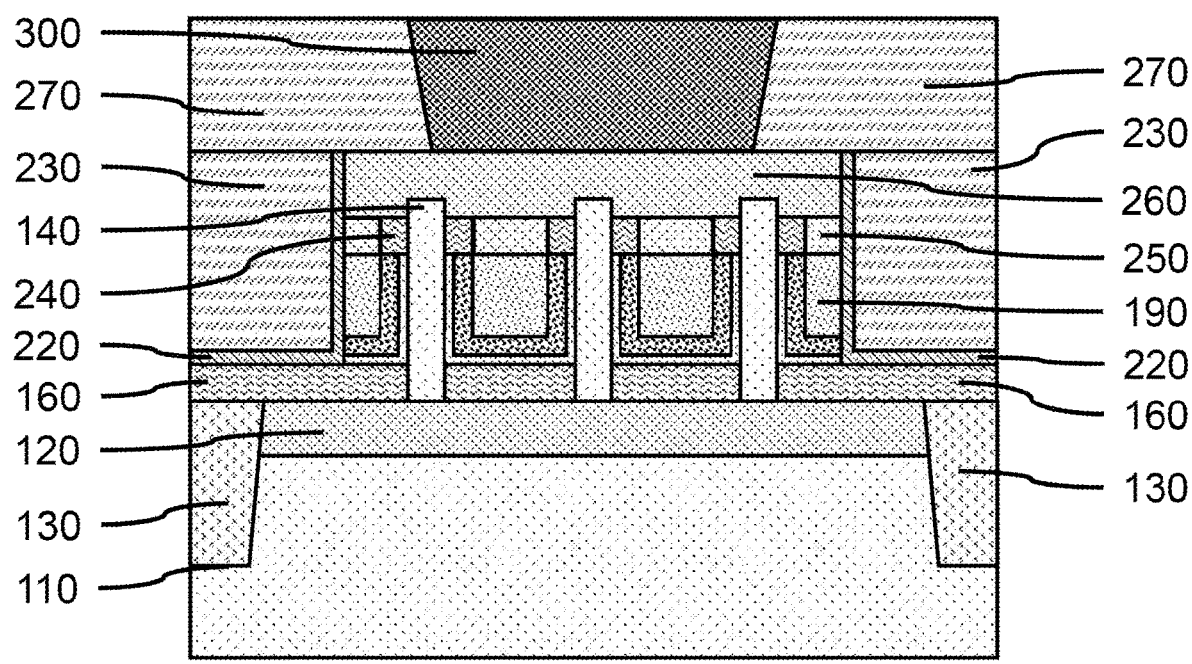
FIG. 20 is a cross-sectional side view of the plurality of vertical fins showing a portion of the cover layer over the plurality of vertical fins removed to expose portions of the metal layer, in accordance with an embodiment of the present invention.

FIG. 20 is a cross-sectional side view of the plurality of vertical fins showing a portion of the cover layer over the plurality of vertical fins removed to expose portions of the metal layer, in accordance with an embodiment of the present invention.

In various embodiments, the top source/drain contacts 300, 305 can be in electrical contact with a top source/drain on a plurality of vertical fins 140. The top source/drains 260, 265 can be physically and electrically separated from the gate structures by the top spacer 240 and gate metal cap 250. In various embodiments, the length of a foot of the adjacent gate structures can be greater than the sidewall-to-sidewall distance, $S_D$, so the gate structure is U-shaped between adjacent vertical fins 140.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments Drily and is not intended to be limiting of example embodiments. As used herein, the singular forms "a," "an" and "the" are intended to include the plural forms as dwell, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A vertical transistor, comprising:
a first set of vertical fins in a first row on a first bottom source/drain layer;
a second set of vertical fins in a second row on a second bottom source/drain layer, wherein the vertical fins in the same row are separated by a spacing with a sidewall-to-sidewall distance, $S_D$, and wherein each of the vertical fins in the first row is separated from an adjacent vertical fin in the second row by a gap distance, $G_D$, such that each pair of adjacent vertical fins in a same column of adjacent rows are separated by an end wall-to-end wall gap having a gap distance, $G_D$, such that the first bottom source/drain layer and the second bottom source/drain layer include opposite dopant types separated by the end wall-to-end wall gap;
a gate metal layer on the first set of vertical fins and the second set of vertical fins, wherein the gate metal layer does not fill in the gap between vertical fins in the same column; and
a gate metal cap on the gate metal layer.

2. The vertical transistor of claim 1, wherein the first bottom source/drain layer is n-doped and the second bottom source/drain layer is p-doped.

3. The vertical transistor of claim 1, wherein the sidewall-to-sidewall distance, $S_D$, is in a range of about 15 nm to about 60 nm.

4. The vertical transistor of claim 1, wherein the end wall-to-end wall gap distance, $G_D$, is in a range of about 30 nm to about 80 nm.

5. The vertical transistor of claim 1, further comprising a common gate contact through the gate metal cap between adjacent vertical fins in the same column, wherein the common gate contact is in electrical contact with the gate metal layer.

6. The vertical transistor of claim 1, further comprising an intervening isolation region formed in the gap between the first bottom source/drain layer and the second bottom source/drain layer.

7. A vertical transistor, comprising:
a plurality of vertical fins on a substrate, where the vertical fins are arranged in at least two rows and at least two columns, wherein the vertical fins in the same row are separated by a spacing with a sidewall-to-sidewall distance, $S_D$, and the vertical fins in the same column of adjacent rows are separated by a gap having a gap distance, $G_D$;
a bottom spacer layer on the substrate;
a gate dielectric layer on the plurality of vertical fins and the bottom spacer layer;
a gate metal layer on the gate dielectric layer, wherein the gate metal layer fills in the spacing between adjacent vertical fins in the same row; and
a work function material layer between the gate dielectric layer and the gate metal layer.

8. The vertical transistor of claim 7, further comprising a common gate contact through the gate metal cap between adjacent vertical fins in the same column, wherein the common gate contact is in electrical contact with the gate metal layer.

9. The vertical transistor of claim 8, further comprising a top source/drain on each of the plurality of vertical fins.

10. The vertical transistor of claim 9, further comprising a first bottom source/drain layer beneath the vertical fins in a first row of the at least two rows, and a second bottom source/drain layer beneath the vertical fins in a second row of the at least two rows.

11. The vertical transistor of claim 10, further comprising forming a top spacer on the gate dielectric layer.

12. The vertical transistor of claim 11, further comprising a protective liner layer on the gate metal layer and the gate metal cap.

13. The vertical transistor of claim 12, further comprising an interlayer dielectric (ILD) layer on the top source/drain, and a top source/drain contact in electrical contact with the top source/drain.

14. The vertical transistor of claim 13, wherein the gate metal cap and the top spacer are made of different dielectric materials.

15. A vertical transistor, comprising:
a plurality of vertical fins on a substrate, where the vertical fins are arranged in at least two rows and at least two columns, wherein the vertical fins in the same row are separated by a spacing with a sidewall-to-sidewall distance, $S_D$, and the vertical fins in the same column of adjacent rows are separated by a gap having a gap distance, $G_D$;
a bottom spacer layer on the substrate between the plurality of vertical fins;
a gate dielectric layer on a portion of each of the plurality of vertical fins and a portion of the bottom spacer layer;
a work function material layer on the gate dielectric layer;
a top spacer on the work function material layer and the gate dielectric layer adjacent to each of the plurality of vertical fins;
a gate metal layer on the work function material layer; and
a gate metal cap on the gate metal layer and adjoining the top spacer.

16. The vertical transistor of claim 15, further comprising a top source/drain on each of the plurality of vertical fins, wherein each of the top source/drains is also on the gate metal cap and top spacer adjacent to each of the plurality of vertical fins.

17. The vertical transistor of claim 16, further comprising a protective liner layer on the gate metal layer and top source/drain on each of the plurality of vertical fins.

18. The vertical transistor of claim 17, wherein the sidewall-to-sidewall distance, $S_D$, is in a range of about 15 nm to about 60 nm.

19. The vertical transistor of claim 18, wherein the end wall-to-end wall gap distance, $G_D$, is in a range of about 30 nm to about 80 nm.

20. The vertical transistor of claim 19, further comprising a common gate contact in electrical contact with a portion of the work function material layer and gate metal layer between vertical fins in the same column of adjacent rows.

* * * * *